US012699641B2

(12) United States Patent (10) Patent No.: US 12,699,641 B2
Coster et al. (45) Date of Patent: Aug. 4, 2026

(54) SIMULATING PERFORMANCE METRICS FOR TARGET SYSTEMS BASED ON SENSOR DATA, SUCH AS FOR USE IN 5G NETWORKS

(71) Applicant: T-Mobile USA, Inc., Bellevue, WA (US)

(72) Inventors: John Coster, Sammamish, WA (US); Anand Kumar Subramaniam, Sammamish, WA (US); Sean Seemann, Seattle, WA (US); Shalini Selvaraj, Snoqualmie, WA (US); Burhan Nurdin, Bothell, WA (US); Mohammad Bari, Woodinville, WA (US); Karthik Kandukoori, Georgetown, TX (US)

(73) Assignee: T-Mobile USA, Inc., Bellevue, WA (US)

( * ) Notice: Subject to any disclaimer, the term of this patent is extended or adjusted under 35 U.S.C. 154(b) by 1068 days.

(21) Appl. No.: 17/502,601

(22) Filed: Oct. 15, 2021

(65) Prior Publication Data

US 2023/0117824 A1 Apr. 20, 2023

(51) Int. Cl.
*G06N 20/00* (2019.01)
*G06F 11/34* (2006.01)
(Continued)

(52) U.S. Cl.
CPC .......... *G06F 11/3457* (2013.01); *G06F 30/20* (2020.01); *G06N 20/00* (2019.01); *G06F 8/65* (2013.01)

(58) Field of Classification Search
CPC .................................................. G06F 11/3457
See application file for complete search history.

(56) References Cited

U.S. PATENT DOCUMENTS 6,411,936 B1 6/2002 Sanders
6,789,054 B1 9/2004 Makhlouf
(Continued)

FOREIGN PATENT DOCUMENTS

CN 104123675 A 10/2014
CN 110147931 A 8/2019
(Continued)

OTHER PUBLICATIONS

"www.afcp.com," via Wayback Machine, accessed Dec. 19, 2024, verified state of website as of Oct. 9, 2021 (https://web.archive.org/web/20211009072241/https://www.akcp.com/). (Year: 2021).*

*Primary Examiner* — Ryan F Pitaro
*Assistant Examiner* — Joseph P Morris
(74) *Attorney, Agent, or Firm* — Perkins Coie LLP

(57) ABSTRACT

A simulator extracts sensor data from multiple systems. The sensor data includes measurements taken by sensors disposed at the multiple systems. The simulator standardizes the sensor data into a common format and classifies the sensor data according to a performance metric. A model of a target system for the performance metric is generated based on the standardized sensor data. The simulator can simulate the impact on the performance metric for a target system based on a simulated change to the multiple systems. The simulator can generate a network interface including a tool that enables end users to interact with the simulation and to determine procedures for mitigating the impact.

17 Claims, 5 Drawing Sheets

(51) Int. Cl.
    *G06F 30/20*    (2020.01)
    *G06F 8/65*     (2018.01)

(56)       References Cited

U.S. PATENT DOCUMENTS

| | | | |
|---|---|---|---|
| 6,832,251 B1 | 12/2004 | Gelvin et al. | |
| 6,859,831 B1 | 2/2005 | Gelvin et al. | |
| 6,971,063 B1 | 11/2005 | Rappaport et al. | |
| 7,020,701 B1 | 3/2006 | Gelvin et al. | |
| 7,246,045 B1 | 7/2007 | Rappaport et al. | |
| 7,519,624 B2 | 4/2009 | Korupolu et al. | |
| 7,644,051 B1 | 1/2010 | Moore et al. | |
| 7,720,968 B2 | 5/2010 | Clarke et al. | |
| 7,805,496 B2 | 9/2010 | Aiber et al. | |
| 8,175,863 B1 | 5/2012 | Ostermeyer et al. | |
| 8,195,504 B2 | 6/2012 | Merrifield et al. | |
| 8,259,099 B2 | 9/2012 | Dillenberger et al. | |
| 8,316,112 B2 * | 11/2012 | Ahmed | G06Q 10/06 709/222 |
| 8,363,543 B2 | 1/2013 | George et al. | |
| 8,396,788 B2 | 3/2013 | Anke | |
| 8,457,945 B1 | 6/2013 | Fielder et al. | |
| 8,533,022 B2 | 9/2013 | Krishnan Nair | |
| 8,630,882 B2 | 1/2014 | Isom | |
| 8,639,650 B1 | 1/2014 | Gill | |
| 8,676,721 B2 | 3/2014 | Piovesan et al. | |
| 8,744,822 B2 | 6/2014 | Mewes et al. | |
| 9,076,343 B2 | 7/2015 | Chaar et al. | |
| 9,311,611 B2 | 4/2016 | Suer et al. | |
| 9,524,505 B2 | 12/2016 | Chao et al. | |
| 9,552,231 B2 | 1/2017 | Mclean | |
| 9,596,358 B2 | 3/2017 | Chiu et al. | |
| 9,659,251 B2 | 5/2017 | Tang et al. | |
| 9,709,965 B2 | 7/2017 | Slessman et al. | |
| 9,747,639 B1 | 8/2017 | Morejon et al. | |
| 9,819,741 B1 | 11/2017 | Pendse | |
| 9,860,763 B2 | 1/2018 | Kravets et al. | |
| 10,002,212 B2 * | 6/2018 | Brock | G06F 30/20 |
| 10,021,138 B2 | 7/2018 | Gill et al. | |
| 10,037,689 B2 | 7/2018 | Taylor | |
| 10,088,836 B2 | 10/2018 | Tyber et al. | |
| 10,210,470 B2 | 2/2019 | Datta Ray | |
| 10,262,265 B2 | 4/2019 | Lu | |
| 10,282,494 B2 | 5/2019 | Mardikar et al. | |
| 10,298,480 B2 | 5/2019 | May et al. | |
| 10,360,527 B2 | 7/2019 | Abe et al. | |
| 10,373,069 B2 | 8/2019 | Kida et al. | |
| 10,412,172 B2 | 9/2019 | Cook | |
| 10,430,248 B2 | 10/2019 | Wiggers et al. | |
| 10,521,863 B2 | 12/2019 | Stoner et al. | |
| 10,599,982 B2 | 3/2020 | Pal et al. | |
| 10,613,962 B1 | 4/2020 | Delange | |
| 10,637,951 B2 | 4/2020 | Siegel et al. | |
| 10,671,507 B2 | 6/2020 | Prabath et al. | |
| 10,719,799 B1 | 7/2020 | Harris et al. | |
| 10,805,184 B2 | 10/2020 | Carroll et al. | |
| 10,867,270 B2 | 12/2020 | Hoover et al. | |
| 10,884,039 B2 | 1/2021 | Siebel et al. | |
| 10,895,855 B2 | 1/2021 | Kelly et al. | |
| 10,921,760 B2 | 2/2021 | Harvey | |
| 10,958,531 B2 * | 3/2021 | Azevedo | H04W 4/38 |
| 10,977,587 B2 | 4/2021 | Khalili | |
| 10,991,262 B2 | 4/2021 | Delisle et al. | |
| 10,996,970 B2 | 5/2021 | Hoseinzadeh et al. | |
| 11,026,376 B2 | 6/2021 | Mewes et al. | |
| 11,068,634 B2 | 7/2021 | Enenkel et al. | |
| 11,109,194 B1 | 8/2021 | Pinheiro et al. | |
| 11,120,369 B2 | 9/2021 | Barrett et al. | |
| 11,989,429 B1 * | 5/2024 | Abrol | G06F 3/0605 |
| 2003/0033229 A1 | 2/2003 | Keyes et al. | |
| 2003/0139907 A1 | 7/2003 | Mccarthy | |
| 2004/0225629 A1 | 11/2004 | Eder | |
| 2005/0154769 A1 | 7/2005 | Woosley et al. | |
| 2005/0250468 A1 | 11/2005 | Lu et al. | |
| 2006/0019679 A1 | 1/2006 | Rappaport et al. | |
| 2006/0167704 A1 | 7/2006 | Thomas et al. | |
| 2006/0184473 A1 | 8/2006 | Eder et al. | |
| 2006/0190310 A1 | 8/2006 | Gudla et al. | |
| 2008/0021651 A1 | 1/2008 | Seeley et al. | |
| 2008/0040364 A1 | 2/2008 | Li | |
| 2009/0144039 A1 | 6/2009 | Thorsteinsson | |
| 2010/0217650 A1 | 8/2010 | Hartnell | |
| 2011/0022434 A1 | 1/2011 | Yao et al. | |
| 2011/0055287 A1 | 3/2011 | Sun et al. | |
| 2011/0087522 A1 | 4/2011 | Beaty et al. | |
| 2012/0078680 A1 | 3/2012 | Tharp | |
| 2012/0244504 A1 | 9/2012 | Wasserman | |
| 2012/0316926 A1 | 12/2012 | Atkinson et al. | |
| 2013/0225294 A1 | 8/2013 | Qaisar | |
| 2013/0339104 A1 | 12/2013 | Bose | |
| 2014/0136381 A1 | 5/2014 | Joseph et al. | |
| 2014/0365017 A1 | 12/2014 | Hanna et al. | |
| 2015/0012147 A1 | 1/2015 | Haghighat-kashani et al. | |
| 2015/0199471 A1 | 7/2015 | Thorsteinsson | |
| 2016/0171909 A1 | 6/2016 | Roozeboom et al. | |
| 2016/0234342 A1 | 8/2016 | Oonk et al. | |
| 2017/0032016 A1 | 2/2017 | Zinner et al. | |
| 2018/0005249 A1 | 1/2018 | Dhanyamraju et al. | |
| 2018/0048150 A1 | 2/2018 | Frasher | |
| 2018/0122506 A1 | 5/2018 | Grantcharov et al. | |
| 2018/0171787 A1 | 6/2018 | Chen et al. | |
| 2018/0191867 A1 | 7/2018 | Siebel et al. | |
| 2019/0279094 A1 | 9/2019 | Baughman et al. | |
| 2019/0347956 A1 | 11/2019 | Daga et al. | |
| 2019/0354838 A1 | 11/2019 | Zhang et al. | |
| 2019/0354873 A1 | 11/2019 | Pescarmona | |
| 2019/0361146 A1 | 11/2019 | Roth et al. | |
| 2020/0188732 A1 | 6/2020 | Kruger | |
| 2020/0231466 A1 | 7/2020 | Lu et al. | |
| 2020/0389387 A1 | 12/2020 | Magzimof et al. | |
| 2021/0042140 A1 | 2/2021 | Paul et al. | |
| 2021/0056459 A1 | 2/2021 | Yerli | |
| 2021/0073028 A1 | 3/2021 | Li et al. | |
| 2021/0089433 A1 | 3/2021 | Mattar et al. | |
| 2021/0209249 A1 | 7/2021 | Hoffer | |
| 2021/0232291 A1 | 7/2021 | Abdulaal et al. | |

FOREIGN PATENT DOCUMENTS

| | | | | |
|---|---|---|---|---|
| CN | 110162556 A | 8/2019 | | |
| CN | 111478312 A | 7/2020 | | |
| CN | 111753664 A | 10/2020 | | |
| CN | 112099939 A | 12/2020 | | |
| EP | 2585941 A1 | 5/2013 | | |
| EP | 2780876 A1 | 9/2014 | | |
| EP | 2858015 A1 | 4/2015 | | |
| EP | 2859782 A1 | 4/2015 | | |
| EP | 2949144 A2 | 12/2015 | | |
| EP | 3371023 A1 | 9/2018 | | |
| EP | 3662331 A2 | 6/2020 | | |
| EP | 3769314 A1 | 1/2021 | | |
| EP | 3830837 A1 | 6/2021 | | |
| KR | 102156287 B1 | 9/2020 | | |
| WO | WO-2010133832 A2 * | 11/2010 | | G06Q 10/00 |
| WO | 2010139167 A1 | 12/2010 | | |
| WO | 2011147047 A2 | 12/2011 | | |
| WO | 2012019317 A1 | 2/2012 | | |
| WO | 2013032955 A1 | 3/2013 | | |
| WO | 2013116233 A1 | 8/2013 | | |
| WO | 2015103698 A1 | 7/2015 | | |
| WO | 2016022108 A1 | 2/2016 | | |
| WO | 2016101638 A1 | 6/2016 | | |
| WO | 2016105181 A2 | 6/2016 | | |
| WO | 2016118684 A1 | 7/2016 | | |
| WO | 2016129775 A1 | 8/2016 | | |
| WO | 2018148732 A2 | 8/2018 | | |
| WO | 2018234741 A1 | 12/2018 | | |
| WO | 2020092804 A1 | 5/2020 | | |
| WO | 2020147349 A1 | 7/2020 | | |
| WO | 2020188585 A1 | 9/2020 | | |
| WO | 2020214421 A1 | 10/2020 | | |
| WO | 2020214699 A1 | 10/2020 | | |

(56) References Cited

FOREIGN PATENT DOCUMENTS

| WO | 2020226979 A2 | 11/2020 |
| WO | 2021046519 A1 | 3/2021 |

* cited by examiner

300

500

SIMULATING PERFORMANCE METRICS FOR TARGET SYSTEMS BASED ON SENSOR DATA, SUCH AS FOR USE IN 5G NETWORKS

BACKGROUND

Performance management is a term used in computer network technology, and generally refers to the monitoring and measurement of relevant performance metrics to assess the performance of computer network resources. Some of the different types and categories of performance management include those related to networks, applications, and information security. Performance management tools and processes deal with the collection, monitoring, and analysis of performance metrics. These metrics can indicate whether a system component is up and running (available), or that the component is behaving in an abnormal way that would impact its ability to function correctly. This type of monitoring includes computer network components and other components such as servers and storage devices, as well as groups of components organized to deliver specific services.

Examples include network performance management, system performance management, and application performance management. In network performance management, a set of functions evaluate and report the effectiveness of a network or network component, and the behavior of telecommunications equipment. System performance management includes monitoring and management of utilization of operating systems resources, including CPU, memory, I/O, and disk usage. In cloud environments events can be defined using monitoring software and actions automated with cloud management Application Programming Interfaces (APIs). In application performance management, systems monitor and manage performance and availability of software applications. In this example, the systems look at workflow and related tools deployed to detect, diagnose, remedy, and report on application performance issues to ensure that application performance meets or exceeds the expectations of end-users and businesses.

BRIEF DESCRIPTION OF THE DRAWINGS

Detailed descriptions of implementations of the present invention will be described and explained through the use of the accompanying drawings.

Figure 1:
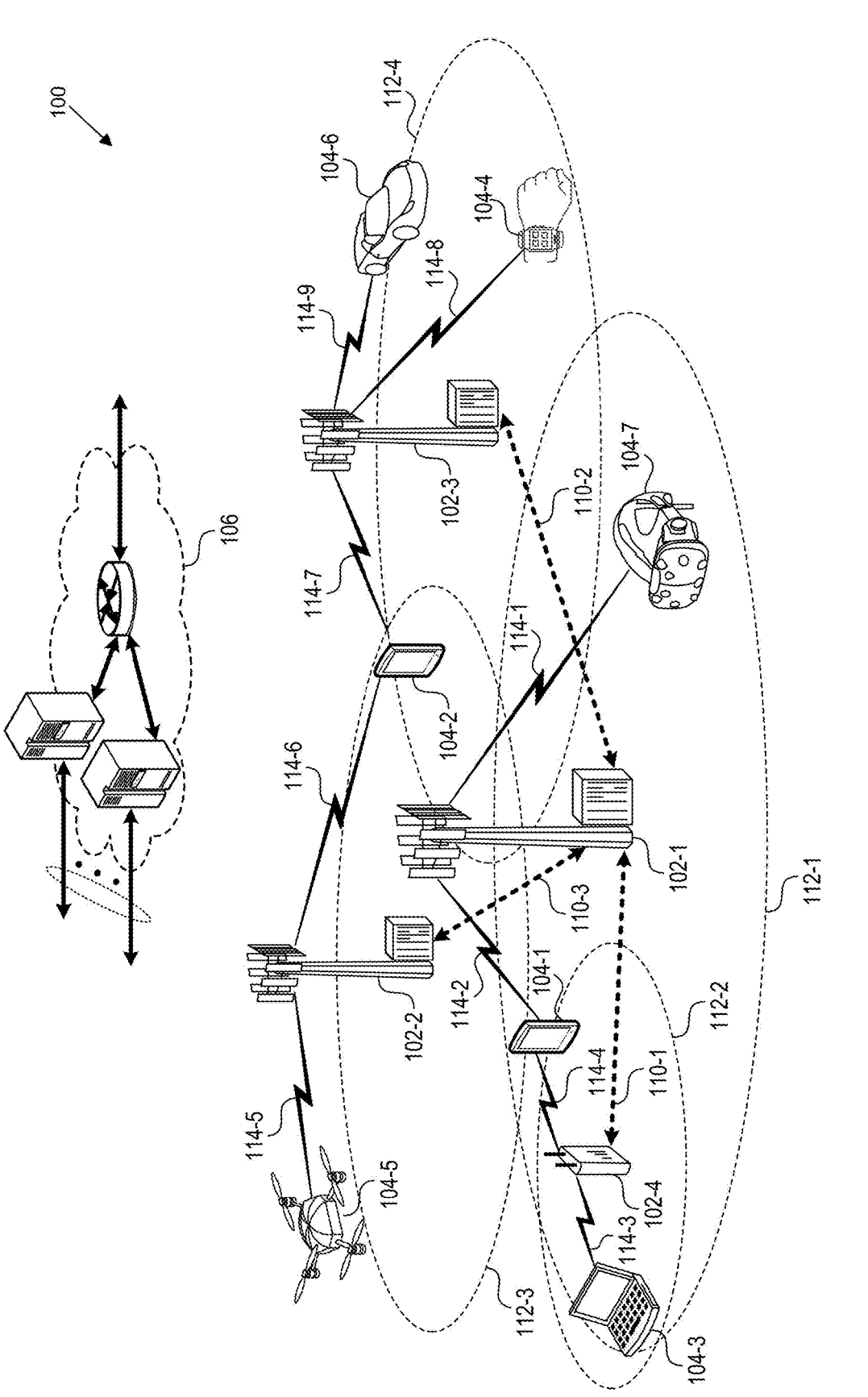
FIG. 1 is a block diagram that illustrates a wireless communications system in which at least some operations described herein can be implemented.

The technologies described herein will become more apparent to those skilled in the art from studying the Detailed Description in conjunction with the drawings. Embodiments or implementations describing aspects of the invention are illustrated by way of example, and the same references can indicate similar elements. While the drawings depict various implementations for the purpose of illustration, those skilled in the art will recognize that alternative implementations can be employed without departing from the principles of the present technologies. Accordingly, while specific implementations are shown in the drawings, the technology is amenable to various modifications.

DETAILED DESCRIPTION

The disclosed technology enables the construction of sophisticated data models that can be used to estimate various performance and/or cost metrics across a computing system or an entire enterprise, as well as devise techniques for improving these performance metrics and/or reducing costs. In one implementation, a platform can be used to significantly reduce and/or optimize power consumption in a multitude of server rooms. Moreover, the optimization can be based not only on the power-handling capabilities of servers themselves, but also on other crucial constraints such as the allowable ambient temperature in each server room.

The disclosed technology can transform data analytics from a reactive exercise into a predictive one, particularly when machine learning (ML) and/or artificial intelligence (AI) is integrated into the analysis of collected sensor data. For example, the platform can predict the impact of incremental changes in 5G, such as an expansion of current cellular-network infrastructure, on target systems or components such as network access nodes. In another example, the platform can predict the impact that a popular new mobile application would have on base stations in a particular, highly populated city. More broadly, by enabling system optimization through robust, real-time system modeling, the platform can be used for efficient risk mitigation with respect to future changes, updates, and/or expansions to complex systems.

The disclosed technology addresses limitations of large technology-service providers that often have sensors distributed throughout their infrastructure. The sensors monitor quality of service (QoS) and resource consumption, among other relevant data. For example, server rooms could have sensors that measure power consumption, network traffic, memory usage, heating, ventilation, and air-conditioning (HVAC). The generated sensor data is usually recorded in a rudimentary format, such as on spreadsheets or as comma-separated values (CSVs) and then stored on a local storage system. Consequently, the sensor data can only be accessed, analyzed, and edited in a manual fashion. Moreover, despite the ubiquity of Internet-connected devices, the necessarily siloed nature of a data-collection framework implies that the sensor data can only be distributed through a "sneakernet," whereby data that is stored on portable hardware devices (e.g., USB flash drives, external hard drives) is manually transported from computer to computer (e.g., by individuals walking around "in sneakers").

Within such a lackluster (or even nonexistent) paradigm of data aggregation, it is not just inconvenient, but wholly infeasible, to process and analyze the large amounts of sensor data that are routinely generated and handled by large companies. Much of this infeasibility stems from the deficiencies in accuracy and precision—as well as the high resource-consumption costs—that are inherent to the manual gathering and processing of large amounts of information, potentially by many different individuals.

In one implementation of the disclosed technology, a centralized data-aggregation system of a platform receives, curates, standardizes, and stores sensor data for future usage, sharing, and distribution. The platform could be further enhanced by the capability to process and analyze sensor data, either as a matter of course or in response to specific requests. Essentially, the platform serves as a common repository that can receive numerous data streams, potentially of different formats, classifications, or taxonomies, from multiple systems and store it at a high fidelity. This repository allows users to access, analyze, and report on the collected sensor data—which further enables the making of informed decisions with respect to cost, capacity, risk, etc., in real-time or near real-time based on the information contained in the sensor data.

Implementations of the technology could exhibit both horizontal and vertical scalability. Horizontal scalability refers to (the aforementioned) aggregation across different systems (possibly involving datasets of different types), such as measuring the temperature and power consumption of all of the server rooms located in a particular geographical region. On the other hand, vertical scalability involves aggregation across different levels/layers of abstraction in an information-technology (IT) stack. For example, possibly relevant or even critical to the optimization of the bottommost level (e.g., the physical infrastructure comprising hardware and electronic circuits) is the information obtained by integrating together and holistically analyzing data culled from other levels: the IT gear that the hardware implements, the operating systems running on top of the gear, the applications installed on the operating systems, and the services provided by the applications.

Embodiments of the technology could also vary their spatial and/or temporal scopes. To achieve the former, the platform could restrict its focus to data from sensors at/in a particular circuit, rack, row, room, floor, building, campus, etc., thereby effecting data processing and analysis at the circuit level, rack level, row level, room level, floor level, building level, or campus level, respectively. To achieve the latter, the platform could restrict its focus to a particular temporal capsule of data, aggregated only from the past day, week, month, year, etc.

Wireless Communications System

FIG. 1 is a block diagram that illustrates a wireless telecommunication network 100 ("network 100") in which aspects of the disclosed technology are incorporated. The network 100 includes base stations 102-1 through 102-4 (also referred to individually as "base station 102" or collectively as "base stations 102"). A base station is a type of network access node (NAN) that can also be referred to as a cell site, a base transceiver station, or a radio base station. The network 100 can include any combination of NANs including an access point, radio transceiver, gNodeB (gNB), NodeB, eNodeB (eNB), Home NodeB or Home eNodeB, or the like. In addition to being a wireless wide area network (WWAN) base station, a NAN can be a wireless local area network (WLAN) access point, such as an Institute of Electrical and Electronics Engineers (IEEE) 802.11 access point.

The NANs of a network 100 formed by the network 100 also include wireless devices 104-1 through 104-7 (referred to individually as "wireless device 104" or collectively as "wireless devices 104") and a core network 106. The wireless devices 104-1 through 104-7 can correspond to or include network 100 entities capable of communication using various connectivity standards. For example, a 5G communication channel can use millimeter wave (mmW) access frequencies of 28 GHz or more. In some implementations, the wireless device 104 can operatively couple to a base station 102 over a long-term evolution/long-term evolution-advanced (LTE/LTE-A) communication channel, which is referred to as a 4G communication channel.

The core network 106 provides, manages, and controls security services, user authentication, access authorization, tracking, Internet Protocol (IP) connectivity, and other access, routing, or mobility functions. The base stations 102 interface with the core network 106 through a first set of backhaul links (e.g., S1 interfaces) and can perform radio configuration and scheduling for communication with the wireless devices 104 or can operate under the control of a base station controller (not shown). In some examples, the base stations 102 can communicate with each other, either directly or indirectly (e.g., through the core network 106), over a second set of backhaul links 110-1 through 110-3 (e.g., X1 interfaces), which can be wired or wireless communication links.

The base stations 102 can wirelessly communicate with the wireless devices 104 via one or more base station antennas. The cell sites can provide communication coverage for geographic coverage areas 112-1 through 112-4 (also referred to individually as "coverage area 112" or collectively as "coverage areas 112"). The geographic coverage area 112 for a base station 102 can be divided into sectors making up only a portion of the coverage area (not shown). The network 100 can include base stations of different types (e.g., macro and/or small cell base stations). In some implementations, there can be overlapping geographic coverage areas 112 for different service environments (e.g., Internet-of-Things (IoT), mobile broadband (MBB), vehicle-to-everything (V2X), machine-to-machine (M2M), machine-to-everything (M2X), ultra-reliable low-latency communication (URLLC), machine-type communication (MTC), etc.).

The network 100 can include a 5G network 100 and/or an LTE/LTE-A or other network. In an LTE/LTE-A network, the term eNB is used to describe the base stations 102, and in 5G new radio (NR) networks, the term gNBs is used to describe the base stations 102 that can include mmW communications. The network 100 can thus form a heterogeneous network 100 in which different types of base stations provide coverage for various geographic regions. For example, each base station 102 can provide communication coverage for a macro cell, a small cell, and/or other types of cells. As used herein, the term "cell" can relate to a base station, a carrier or component carrier associated with the base station, or a coverage area (e.g., sector) of a carrier or base station, depending on context.

A macro cell generally covers a relatively large geographic area (e.g., several kilometers in radius) and can allow access by wireless devices that have service subscriptions with a wireless network 100 service provider. As indicated earlier, a small cell is a lower-powered base station, as compared to a macro cell, and can operate in the same or different (e.g., licensed, unlicensed) frequency bands as macro cells. Examples of small cells include pico cells, femto cells, and micro cells. In general, a pico cell can cover a relatively smaller geographic area and can allow unrestricted access by wireless devices that have service subscriptions with the network 100 provider. A femto cell covers a relatively smaller geographic area (e.g., a home) and can provide restricted access by wireless devices having an association with the femto unit (e.g., wireless devices in a closed subscriber group (CSG), wireless devices for users in the home). A base station can support one or multiple (e.g., two, three, four, and the like) cells (e.g., component carriers). All fixed transceivers noted herein that can provide access to the network 100 are NANs, including small cells.

The communication networks that accommodate various disclosed examples can be packet-based networks that operate according to a layered protocol stack. In the user plane, communications at the bearer or Packet Data Convergence Protocol (PDCP) layer can be IP-based. A Radio Link Control (RLC) layer then performs packet segmentation and reassembly to communicate over logical channels. A Medium Access Control (MAC) layer can perform priority handling and multiplexing of logical channels into transport channels. The MAC layer can also use Hybrid ARQ (HARQ) to provide retransmission at the MAC layer, to improve link efficiency. In the control plane, the Radio Resource Control (RRC) protocol layer provides establishment, configuration, and maintenance of an RRC connection between a wireless device 104 and the base stations 102 or core network 106 supporting radio bearers for the user plane data. At the Physical (PHY) layer, the transport channels are mapped to physical channels.

As illustrated, the wireless devices 104 are distributed throughout the network 100, where each wireless device 104 can be stationary or mobile. A wireless device can be referred to as a mobile station, a subscriber station, a mobile unit, a subscriber unit, a wireless unit, a remote unit, a handheld mobile device, a remote device, a mobile subscriber station, an access terminal, a mobile terminal, a wireless terminal, a remote terminal, a handset, a mobile client, a client, or the like. Examples of a wireless device include user equipment (UE) such as a mobile phone, a personal digital assistant (PDA), a wireless modem, a handheld mobile device (e.g., wireless devices 104-1 and 104-2), a tablet computer, a laptop computer (e.g., wireless device 104-3), or a wearable (e.g., wireless device 104-4). A wireless device can be included in another device such as, for example, a drone (e.g., wireless device 104-5), a vehicle (e.g., wireless device 104-6), an augmented reality/virtual reality (AR/VR) device such as a head-mounted display device (e.g., wireless device 104-7), an IoT device such as an appliance in a home, a portable gaming console, or a wirelessly connected sensor that provides data to a remote server over a network.

A wireless device can communicate with various types of base stations and network 100 equipment at the edge of a network 100 including macro eNBs/gNBs, small cell eNBs/gNBs, relay base stations, and the like. A wireless device can also communicate with other wireless devices either within or outside the same coverage area of a base station via device-to-device (D2D) communications.

The communication links 114-1 through 114-9 (also referred to individually as "communication link 114" or collectively as "communication links 114") shown in network 100 include uplink (UL) transmissions from a wireless device 104 to a base station 102, and/or downlink (DL) transmissions from a base station 102 to a wireless device 104. The downlink transmissions can also be called forward link transmissions while the uplink transmissions can also be called reverse link transmissions. Each communication link 114 includes one or more carriers, where each carrier can be a signal composed of multiple sub-carriers (e.g., waveform signals of different frequencies) modulated according to the various radio technologies. Each modulated signal can be sent on a different sub-carrier and carry control information (e.g., reference signals, control channels), overhead information, user data, etc. The communication links 114 can transmit bidirectional communications using frequency division duplex (FDD) (e.g., using paired spectrum resources) or Time division duplex (TDD) operation (e.g., using unpaired spectrum resources). In some implementations, the communication links 114 include LTE and/or mmW communication links.

In some implementations of the network 100, the base stations 102 and/or the wireless devices 104 include multiple antennas for employing antenna diversity schemes to improve communication quality and reliability between base stations 102 and wireless devices 104. Additionally, or alternatively, the base stations 102 and/or the wireless devices 104 can employ multiple-input, multiple-output (MIMO) techniques that can take advantage of multi-path environments to transmit multiple spatial layers carrying the same or different coded data.

Predictive Simulations Based on Sensor Data

Figure 2:
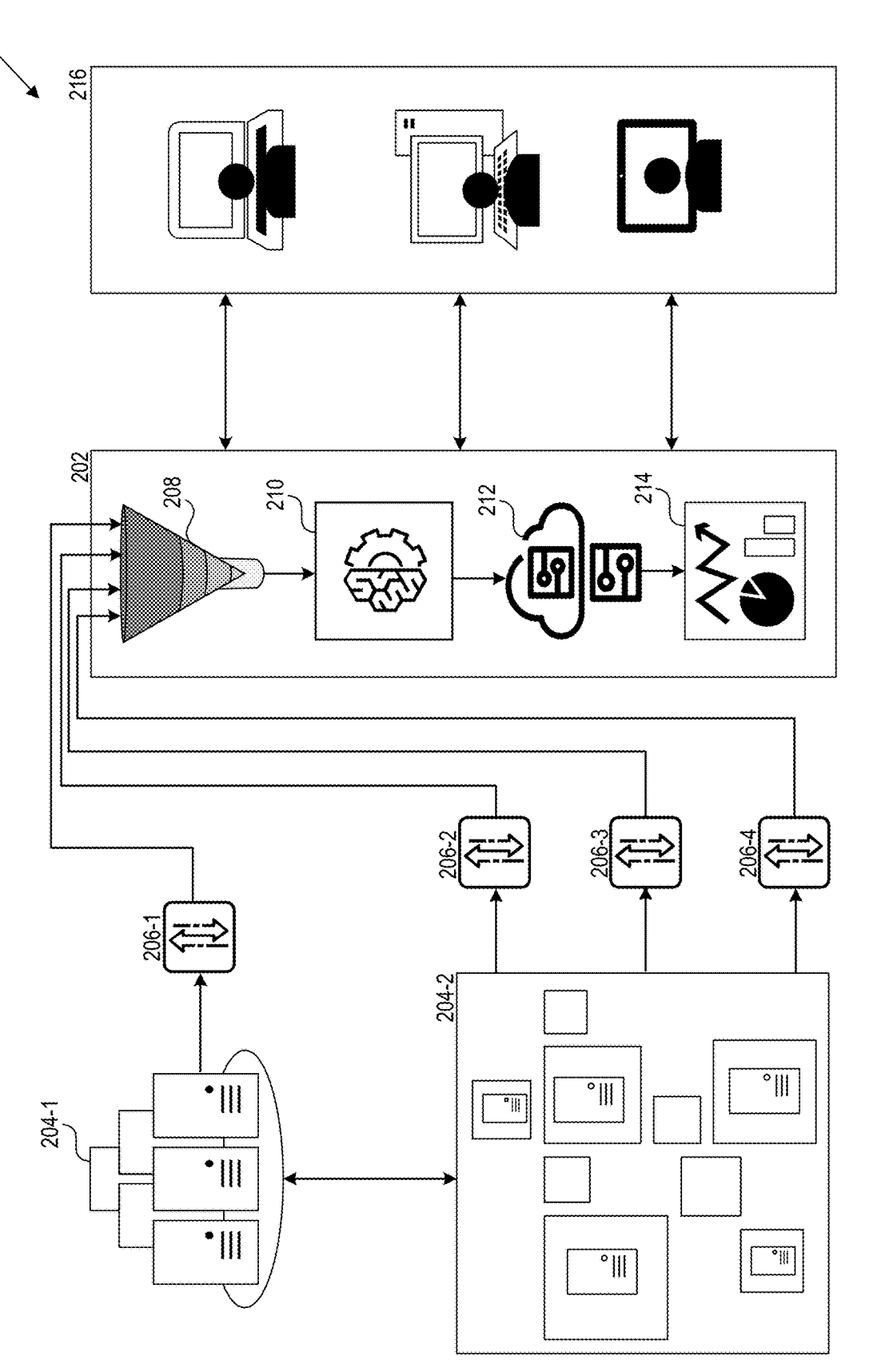
FIG. 2 is a block diagram that illustrates a system that can simulate an impact on a performance metric for a target system.

FIG. 2 is a block diagram that illustrates a system that can simulate an impact on a performance metric for a target system. As shown, the system 200 includes a simulator 202 that is configured to obtain datasets from multiple systems 204. The multiple systems 204-1 and 204-2 (collectively referred to as the "multiple systems 204") include a datacenter 204-1 that serves as a repository for data and other systems 204-2. The multiple systems 204 include an individual system (e.g., datacenter 204-1) and a group of systems (e.g., other systems 204-2). In one example, the individual system is an on-premises system of an enterprise while other systems can be external to the enterprise.

The multiple systems 204 include one or more nodes that have hardware (e.g., circuits, processors, memory, network interfaces, etc.) and/or software (e.g., operating systems, applications). In one example, the other systems 204-1 can constitute components of a telecommunications system include network nodes such as base stations, core network nodes, etc. In that example, the data center 204-1 can include application data of network subscribers or of a third-party service. The data center 204-1 and the other systems 204-2 are at different geographic locations. In another example, the multiple systems can include Internet-of-Things (IoT) systems or devices that are intermittently coupled.

The multiple systems 204 include sensors 206-1 through 206-4 (collectively referred to as "sensors 206") disposed thereon or located thereat. The sensors 206 can measure physical properties of nodes or their surroundings including, for example, temperatures of components or ambient temperatures, power consumption, airflows of a cooling system, network loads, capacities (e.g., storage, processing), and any other measures that are indicative of the performance of a system or its components. That is, the sensor data can be used to determine values for performance metrics such as a power-handling capability of a storage system at a particular state or within a range of capacity utilizations. The sensors 206 can be disposed on the same or different components of the same or different systems or nodes. For example, power consumption sensors can be stored at each of multiple systems or at different components such as temperature sensors disposed on circuits, racks, rows, rooms, and/or geographic locations of datacenters. Given that the sensors 206 can measure different properties of the same or different devices, the sensor data can have different formats, implement different taxonomies, and/or conform with different protocols.

The datasets including sensor data generated by the sensors 206 of the multiple systems 204 are communicated over communications channels to the simulator 202. For example, the datasets can be communicated in data streams from the multiple systems 204 to the simulator 202. The sensor data can be periodically generated by the sensors 206 and/or periodically communicated (e.g., every 5 minutes, twice daily) to the simulator 202, which is configured to, for example, perform data mining including standardization, which enable analytics based on a simulation of the impact on one or more performance metrics for a target system in response to a change (e.g., a simulated change) to the target system or another system. As such, the simulator 202 includes a data mining component 208, which implements processes for extracting and discovering patterns in large datasets. The data mining component 208 has an overall goal of extracting data from datasets for transforming the extracted data into information that has a comprehensible structure for further use. The data mining can also involve database and data management, data pre-processing, model and inference considerations, metrics processing, complexity considerations, post-processing of discovered structures, visualization, etc.

The data mining component 208 can standardize sensor data to have a common format or use a common taxonomy. Further, the sensor data can be classified for a particular performance metric. For example, the data mining component 208 can extract temperature measurements of storage systems and classify the sensor data in terms of the locations of the sensors that captured the temperature measurements, the types devices on which the sensors are attached, and/or other dimensions that can be used for classifying the sensor data. In another example, the data mining component 208 performs data aggregation to compile data extracted from datasets and combined to prepare new datasets to optimize processing by other components of the simulator 202.

The simulator 202 includes a modeling component 210 such as machine learning (ML) modeling algorithms, which constructs computer algorithms that automatically improve themselves through experience and with additional data. For example, the ML algorithms can build a model based on sample sensor data (i.e., "training data") to enable forecasting or making predictions or decisions as to the future state of a system based on a simulated change to the same system or another system. In another example, the modeling component 210 includes a cataloging function that is created an updated manually based on the standardized sensor data such that the impact of a performance metric for a target system can be predicted when comparing data against the catalog of sensor data and performing interpolation or other numerical, computational, or statistical methods to extrapolate how a change can impact the performance of a target system or another system.

The simulator 202 includes a simulation component 212 configured to simulate the state of one or more systems in response to a change in any of those systems or another system. For example, the simulation component 212 can simulate the effect of expanding a storage system with an additional rack, increasing the network traffic to a network access node of a telecommunications network, or deploying a particular mobile application on end user devices of the telecommunications network. In other words, the simulation component 212 generates an imitation of a system and/or process of a real-world system or process based on sensor data. The simulations require the use of models generated by the model component 210, which represent key characteristics or behaviors of a targeted system or process, whereas the simulation represents the evolution of the model over time or in response to a change in the modeled system or process.

The simulator 202 includes an analytics component 214 that can generate and/or administer a network portal. An example includes an online web-based portal that can display the simulation or associated data in visualizations or other user-friendly features that enable end users 216 to investigate the simulation and learn procedures for mitigating the impact on performance metrics for target systems in response to simulated changes. The analytics component 214 enables continuous iterative exploration and investigation of past performance to predict future performance in different scenarios. The analytics component 214 utilizes statistical methods to form a data-driven understanding of a target system and associated systems, and to develop new insights into the performance of the multiple systems 204. The analytics component 214 makes extensive use of tools and analytical modeling and numerical analysis, including explanatory and predictive modeling, as well as fact-based management to drive decision-making.

The end users 216 include any end user devices operable by users or computing devices that are authorized to access components or data processed by the simulator 202. In one example, the end users 216 are assigned roles that grant access to one, any, or all components of the simulator 202. For example, an end user with a reviewer role is only permitted access to the analytics component 214 whereas an end user with an administrator role is permitted to access all of the components of the simulator 202 to, for example edit the model of the modeling component 210 or modify how datasets are aggregated by the data mining component 208.

Figure 3:
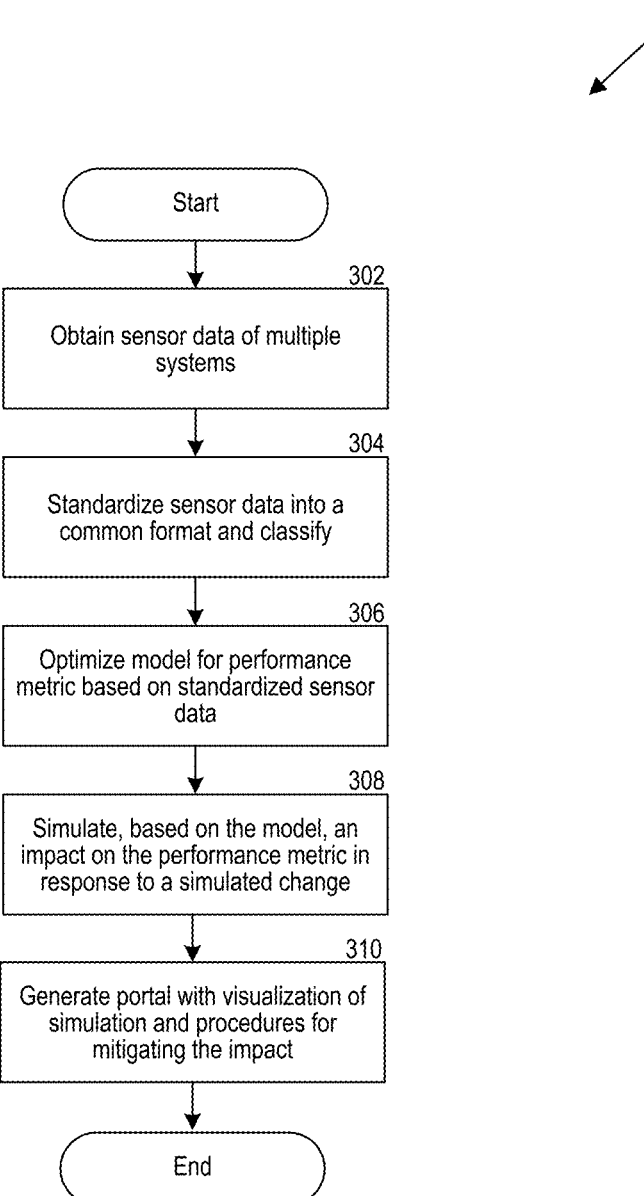
FIG. 3 is flowchart that illustrates a process for simulating an impact on a performance metric for a target system.

FIG. 3 is flowchart that illustrates a process for simulating an impact on a performance metric for a target system. The process 300 can be performed by a simulator (e.g., simulator 202) coupled to multiple systems (e.g., multiple systems 204). In one example, the simulator includes a service that enables a network such as a telecommunications network to test changes to the network or associated third-party networks or components. For example, the simulator can be used to determine how adding or removing a datacenter will affect the performance of the telecommunications network.

At 302, the simulator obtains datasets including sensor data of multiple systems. For example, the simulator can extract the sensor data in parallel from respective data streams of the multiple systems coupled to a network (e.g., a telecommunications network). In one example, the multiple systems include an on-premises system and a system external to network. The sensor data can be periodically generated by sensors on disposed at or located on the multiple systems. The sensor data can also be extracted periodically in batches from the multiple data streams. The sensor data can include measurements such as temperature or power consumption values output by the sensors disposed at the systems or their components.

At 304, the simulator can standardize the sensor data extracted from the datasets. For example, the sensor data can be transformed from different formats into sensor data that has a common format. The transformation can provide a common taxonomy for the sensor data which enables curating or searching the sensor data more efficiently compared to the original sensor data. The sensor data can be classified into a classification framework for performance metrics. In one example, the performance metrics include a power-handling capability. Other examples include power consumption, availability, response time, capacity, latency, completion time, service time, bandwidth, throughput, relative efficiency, scalability, performance per power unit, a compression ratio, and the like. In one implementation, the sensor data that is extracted from datasets of multiple systems is aggregated as part of the standardization. The different datasets can include measurements of temperature and measurements of power consumption generated at the multiple systems. As such, the standardized sensor data includes the aggregate sensor data for different classifications of temperature or power consumption.

The simulator can aggregate different datasets across different dimensions of the multiple systems. For example, sensor data can be aggregated across levels or layers of abstraction of the systems. Examples of the layers/levels include physical hardware, system software on the physical hardware, applications on the system software, and services provided by the applications. The standardized sensor data thus includes aggregate sensor data and the classification and/or resulting taxonomy is based on the levels of abstraction. The simulator can aggregate the sensor data across other dimensions such as spatial or temporal dimensions. For example, a spatial dimension can restrict sensor data to sensors disposed at/on particular circuitry, devices, or structures of the multiple systems. The standardized sensor data thus includes aggregate sensor data and the classification and/or resulting taxonomy is based on the spatial dimension. A temporal dimension can restrict the sensor data to particular timeframe(s) when the sensor data was generated or captured. The standardized sensor data can thus include the aggregate sensor data and the classification and/or taxonomy is based on the temporal dimension.

At 306, the simulator can adjust (e.g., optimize) a model of a selected target system based on the standardized sensor data and in accordance with the classification for the selected performance metric. That is, the model can be trained based on the standardized sensor data to improve predictions that are made based on the model. In one example, the model is an ML model that updates in response to new or additional training data. In another example, the model includes a catalogue of sensor data that of systems or components and/or indicative of their states. For example, a model for a datacenter can be constructed based on temperature readings generated periodically by sensors on different circuits, rows, racks, or rooms of storage systems. The temperature readings are key characteristics that can be used to generate a model used later to extrapolate the impact of a power-handling performance metric when a new rack is added/removes to the datacenter or the network traffic is doubled or halved.

At 308, the simulator can simulate, based on the model, a change to the target system and a resulting impact on the performance metric for that target system or another system coupled to the target system. For example, a simulation can be used to predict an impact on a performance metric in response to a simulated update or a simulated expansion/contraction in a cellular-network infrastructure. In another example, the simulation can be used to predict an impact on network access in response to deployment of a mobile application on multiple mobile devices on a telecommunications network. In another example, the simulator can predict, based on the model, an impact on a cost metric in response to the simulated change to the multiple systems. For example, the multiple systems can include storage systems of datacenters operated by a telecommunications network where a datacenter is simulated to determine the power consumption by the particular server room of the datacenter. The simulator can constrain a simulation to a threshold value for the performance metric to limit the scope of the simulation.

At 310, the simulator can generate and/or administer a portal that includes a visualization of the simulation. As such, end users can readily understand the impact on the performance metric for a target system. In one example, the portal is a web-based interface that enables an end user to interact with the visualization, which includes one or more tools through which the end users can interact with the simulation. In one example, a tool can determine procedures for mitigating the impact on the performance metric for the target system such as shifting network traffic from one datacenter to another. In one example, the web-based interface includes an interactive tool that can predict an impact on the cost metric or determine a process for reducing the cost metric. For example, the interactive tool can include runnable code or present narrative text for performing analytics to mitigate the impact on the power-handling capability of storage system in response to a simulated change (e.g., update, or expansion/contraction) to a storage system of a datacenter. Upon interaction with the end user, the interactive tool of the web-based interface can be configured to execute the runnable code to perform analytics to mitigate the impact in response to the simulated change. Another example includes an interactive decision-making tool that enables real-time analytics with respect to a cost metric, capacity of a target system, and/or a risk of malfunction or failure.

Figure 4:
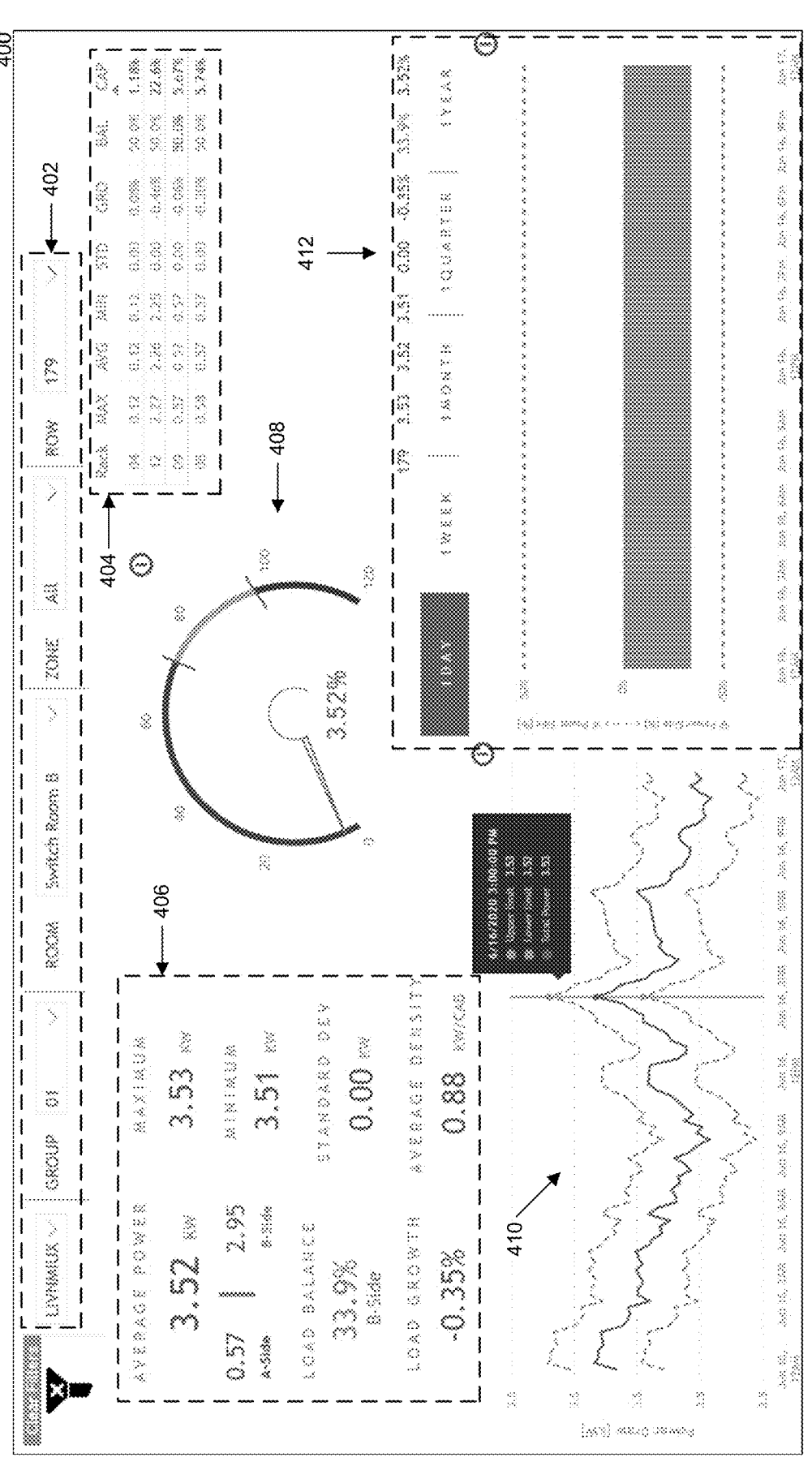
FIG. 4 illustrates an interface including visualizations that enable end users to interact with a simulation and determine a procedure for mitigating an impact on a performance metric for a target system.

FIG. 4 illustrates an example of a network interface including visualizations that enable end users to interact with a simulation and determine a procedure for mitigating an impact on a performance metric for a target system. As shown, the interface 400 includes a filter 402 including dropdown controls for selecting components of a storage system. As such, end users can use the filter 402 to simulate the storage system at different levels of granularity. The interface 400 also includes component statistics 404 and system statistics 406, as well as a graphical meter 408 that shows the state of the storage system in terms of degrees of risk. The interface 400 also shows a historical graph 410 that illustrates power draw over a timeframe and a power consumption graph 412.

Computer System

Figure 5:
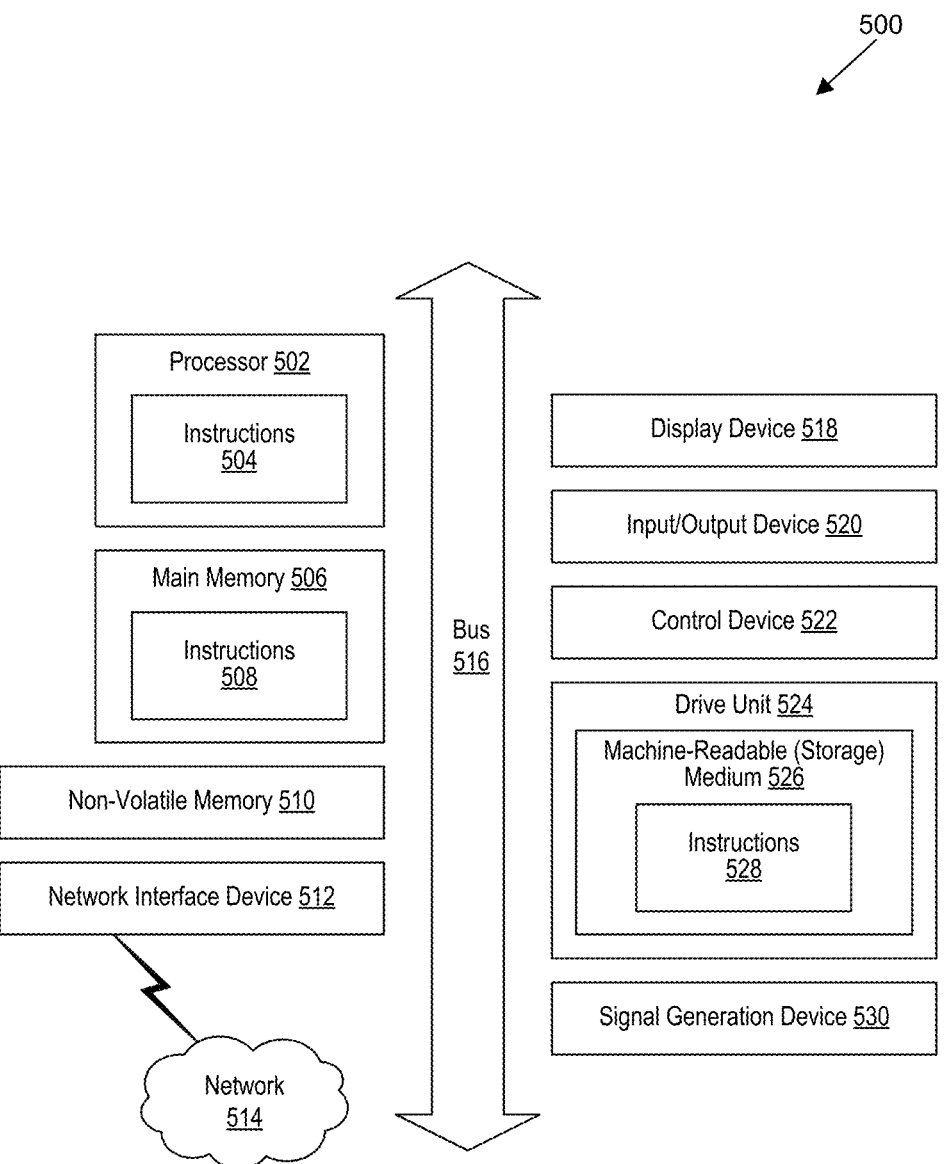
FIG. 5 is a block diagram that illustrates an example of a computer system in which at least some operations described herein can be implemented.

FIG. 5 is a block diagram that illustrates an example of a computer system 500 in which at least some operations described herein can be implemented. As shown, the computer system 500 can include: one or more processors 502, main memory 506, non-volatile memory 510, a network interface device 512, video display device 518, an input/output device 520, a control device 522 (e.g., keyboard and pointing device), a drive unit 524 that includes a storage medium 526, and a signal generation device 530 that are communicatively connected to a bus 516. The bus 516 represents one or more physical buses and/or point-to-point connections that are connected by appropriate bridges, adapters, or controllers. Various common components (e.g., cache memory) are omitted from FIG. 5 for brevity. Instead, the computer system 500 is intended to illustrate a hardware device on which components illustrated or described relative to the examples of the figures and any other components described in this specification can be implemented.

The computer system 500 can take any suitable physical form. For example, the computing system 500 can share a similar architecture as that of a server computer, personal computer (PC), tablet computer, mobile telephone, game console, music player, wearable electronic device, network-connected ("smart") device (e.g., a television or home assistant device), AR/VR systems (e.g., head-mounted display), or any electronic device capable of executing a set of instructions that specify action(s) to be taken by the computing system 500. In some implementation, the computer system 500 can be an embedded computer system, a system-on-chip (SOC), a single-board computer system (SBC) or a distributed system such as a mesh of computer systems or include one or more cloud components in one or more networks. Where appropriate, one or more computer systems 500 can perform operations in real-time, near real-time, or in batch mode.

The network interface device 512 enables the computing system 500 to mediate data in a network 514 with an entity that is external to the computing system 500 through any communication protocol supported by the computing system 500 and the external entity. Examples of the network interface device 512 include a network adaptor card, a wireless network interface card, a router, an access point, a wireless router, a switch, a multilayer switch, a protocol converter, a gateway, a bridge, bridge router, a hub, a digital media receiver, and/or a repeater, as well as all wireless elements noted herein.

The memory (e.g., main memory 506, non-volatile memory 510, machine-readable medium 526) can be local, remote, or distributed. Although shown as a single medium, the machine-readable medium 526 can include multiple media (e.g., a centralized/distributed database and/or associated caches and servers) that store one or more sets of instructions 528. The machine-readable (storage) medium 526 can include any medium that is capable of storing, encoding, or carrying a set of instructions for execution by the computing system 500. The machine-readable medium 526 can be non-transitory or comprise a non-transitory device. In this context, a non-transitory storage medium can include a device that is tangible, meaning that the device has a concrete physical form, although the device can change its physical state. Thus, for example, non-transitory refers to a device remaining tangible despite this change in state.

Although implementations have been described in the context of fully functioning computing devices, the various examples are capable of being distributed as a program product in a variety of forms. Examples of machine-readable storage media, machine-readable media, or computer-readable media include recordable-type media such as volatile and non-volatile memory devices 510, removable flash memory, hard disk drives, optical disks, and transmission-type media such as digital and analog communication links.

In general, the routines executed to implement examples herein can be implemented as part of an operating system or a specific application, component, program, object, module, or sequence of instructions (collectively referred to as "computer programs"). The computer programs typically comprise one or more instructions (e.g., instructions 504, 508, 528) set at various times in various memory and storage devices in computing device(s). When read and executed by the processor 502, the instruction(s) cause the computing system 500 to perform operations to execute elements involving the various aspects of the disclosure.

Remarks

The terms "example", "embodiment" and "implementation" are used interchangeably. For example, reference to "one example" or "an example" in the disclosure can be, but not necessarily are, references to the same implementation; and, such references mean at least one of the implementations. The appearances of the phrase "in one example" are not necessarily all referring to the same example, nor are separate or alternative examples mutually exclusive of other examples. A feature, structure, or characteristic described in connection with an example can be included in another example of the disclosure. Moreover, various features are described which can be exhibited by some examples and not by others. Similarly, various requirements are described which can be requirements for some examples but no other examples.

The terminology used herein should be interpreted in its broadest reasonable manner, even though it is being used in conjunction with certain specific examples of the invention. The terms used in the disclosure generally have their ordinary meanings in the relevant technical art, within the context of the disclosure, and in the specific context where each term is used. A recital of alternative language or synonyms does not exclude the use of other synonyms. Special significance should not be placed upon whether or not a term is elaborated or discussed herein. The use of highlighting has no influence on the scope and meaning of a term. Further, it will be appreciated that the same thing can be said in more than one way.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import can refer to this application as a whole and not to any particular portions of this application. Where context permits, words in the above Detailed Description using the singular or plural number may also include the plural or singular number respectively. The word "or" in reference to a list of two or more items covers all of the following interpretations of the word: any of the items in the list, all of the items in the list, and any combination of the items in the list. The term "module" refers broadly to software components, firmware components, and/or hardware components.

While specific examples of technology are described above for illustrative purposes, various equivalent modifications are possible within the scope of the invention, as those skilled in the relevant art will recognize. For example, while processes or blocks are presented in a given order, alternative implementations can perform routines having steps, or employ systems having blocks, in a different order, and some processes or blocks may be deleted, moved, added, subdivided, combined, and/or modified to provide alternative or sub-combinations. Each of these processes or blocks can be implemented in a variety of different ways. Also, while processes or blocks are at times shown as being performed in series, these processes or blocks can instead be performed or implemented in parallel, or can be performed at different times. Further, any specific numbers noted herein are only examples such that alternative implementations can employ differing values or ranges.

Details of the disclosed implementations can vary considerably in specific implementations while still being encompassed by the disclosed teachings. As noted above, particular terminology used when describing features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific examples disclosed herein, unless the above Detailed Description explicitly defines such terms. Accordingly, the actual scope of the invention encompasses not only the disclosed examples, but also all equivalent ways of practicing or implementing the invention under the claims. Some alternative implementations can include additional elements to those implementations described above or include fewer elements.

Any patents and applications and other references noted above, and any that may be listed in accompanying filing papers, are incorporated herein by reference in their entireties, except for any subject matter disclaimers or disavowals, and except to the extent that the incorporated material is inconsistent with the express disclosure herein, in which case the language in this disclosure controls. Aspects of the invention can be modified to employ the systems, functions, and concepts of the various references described above to provide yet further implementations of the invention.

To reduce the number of claims, certain implementations are presented below in certain claim forms, but the applicant contemplates various aspects of an invention in other forms. For example, aspects of a claim can be recited in a means-plus-function form or in other forms, such as being embodied in a computer-readable medium. A claim intended to be interpreted as a mean-plus-function claim will use the words "means for." However, the use of the term "for" in any other context is not intended to invoke a similar interpretation. The applicant reserves the right to pursue such additional claim forms in either this application or in a continuing application.

The invention claimed is:

1. A non-transitory, computer-readable storage medium carrying instructions, which, when executed by at least one data processor of a system, cause the system to:
   extract datasets including sensor data from respective data streams of multiple systems coupled to a telecommunications network,
      wherein the sensor data is extracted in parallel as data batches from the multiple data streams,
      wherein the sensor data includes temperature and power consumption readings of sensors disposed on components of the multiple systems,
      wherein the sensor data is periodically received from the sensors disposed on the components of the multiple systems;
   standardize the sensor data into a common format and into a classification for a performance metric,
      wherein the performance metric is related to a capability of the multiple systems based on the temperature and power consumption readings of the sensors,
      wherein the sensor data is aggregated across a temporal dimension to classify the sensor data to one or more timeframes when the sensor data was generated or captured,
      wherein the sensor data is further aggregated across a spatial dimension to classify the sensor data based on whether the sensors are disposed on circuitry, devices, or structures of the multiple systems, and
      wherein the standardized sensor data includes the aggregate sensor data and the classification is based on the temporal dimension and the spatial dimension;
   adjust a model of a target system of the multiple systems based on the standardized sensor data and in accordance with the classification for the performance metric;
   simulate, based on the model, a change to the target system and a resulting impact on the performance metric for the telecommunications network,
      wherein the change to the target system includes an update to software in the target system or a hardware expansion or contraction in the target system;

determine, based on simulating the change to the target system and the resulting impact on the performance metric, a procedure for mitigating the resulting impact on the performance metric for the telecommunications network;
   generate a software network interface including a visualization of the simulation including the resulting impact on the performance metric for the telecommunications network,
      wherein the software network interface enables an end user to interact with the visualization, and
      wherein the software network interface includes an indication of a procedure to mitigate the resulting impact on the performance metric; and
   perform the procedure for mitigating the resulting impact on the performance metric for the telecommunications network when updating the software in the target system or performing the hardware expansion or contraction in the target system.

2. The non-transitory computer-readable storage medium of claim 1, wherein the telecommunications network includes 5G network components, and wherein to simulate the change and the resulting impact comprises causing the system to:
   predict a first impact on the telecommunications network in response to a simulated expansion in a cellular-network infrastructure.

3. The non-transitory computer-readable storage medium of claim 1, wherein to simulate the change and the resulting impact comprises causing the system to:
   predict a second impact on network access to the telecommunications network in response to a simulated deployment of a mobile application on multiple mobile devices on the telecommunications network.

4. The non-transitory computer-readable storage medium of claim 1:
   wherein the target system corresponds to a datacenter of the telecommunications network, and
   wherein the software network interface includes runnable code or presents text related to the simulation of the resulting impact on the performance metric for the telecommunications network.

5. The non-transitory computer-readable storage medium of claim 1, wherein the system is further caused to:
   predict, based on the model, a third impact on a cost metric in response to the simulated change to the target system,
      wherein the software network interface includes the third impact on the cost metric and a procedure for reducing the cost metric.

6. The non-transitory computer-readable storage medium of claim 1, wherein to generate the software network interface comprises causing the system to:
   generate an interactive decision-making tool that enables real-time analytics with respect to a cost metric and a risk to the telecommunications network based on the simulated change.

7. The non-transitory computer-readable storage medium of claim 1:
   wherein the multiple systems include multiple storage systems of the telecommunications network,
   wherein the target system includes a particular storage system of the multiple storage systems, and
   wherein the performance metric includes a power consumption of the storage system.

8. The non-transitory computer-readable storage medium of claim 1, wherein to standardize the sensor data comprises causing the system to:

aggregate datasets of the sensor data across the multiple systems, which are located at different geographic regions, and wherein the standardized sensor data includes the aggregate sensor data and the classification is based on the different geographic regions.

9. The non-transitory computer-readable storage medium of claim 1, wherein to standardize the sensor data comprises causing the system to:

aggregate datasets of the sensor data across layers of abstraction for the multiple systems, wherein the layers include a physical hardware, system software on the physical hardware, an application on the system software, and a service of the application, and wherein the standardized sensor data includes the aggregate sensor data and the classification is based on levels of abstraction.

10. The non-transitory computer-readable storage medium of claim 1, wherein to simulate the resulting impact on the performance metric comprises causing the system to:

constrain the simulation to a threshold value for the performance metric.

11. A system comprising:

at least one hardware processor; and at least one non-transitory memory storing instructions, which, when executed by the at least one hardware processor, cause the system to:

extract sensor data from multiple systems of a network, wherein the sensor data includes measurements taken by sensors disposed at the multiple systems, wherein the sensor data includes temperature and power consumption readings of sensors disposed on components of the multiple systems, and wherein the sensor data is periodically received from the sensors disposed on the components of the multiple systems;

standardize the sensor data into a common format and into a classification for a performance metric, wherein the performance metric includes a capability of the multiple systems based on the temperature and power consumption readings of the sensors, wherein the sensor data is aggregated across a temporal dimension to classify the sensor data to one or more timeframes when the sensor data was generated or captured, wherein the sensor data is further aggregated across a spatial dimension to classify the sensor data based on whether the sensors are disposed on circuitry, devices, or structures of the multiple systems, and wherein the standardized sensor data includes the aggregate sensor data and the classification is based on the temporal dimension and the spatial dimension;

adjust a machine learning (ML) model for the performance metric based on the standardized sensor data and in accordance with the classification;

simulate, based on the ML model, an impact on the performance metric in response to a simulated change of a target system;

determine, based on simulating the change to the target system and the resulting impact on the performance metric, a procedure for mitigating the impact on the performance metric when performing the change to the target system;

perform the procedure for mitigating the impact on the performance metric when performing the change to the target system; and administer a network portal that enables interactive analytics for engaging with the simulation and the impact on the performance metric.

12. The system of claim 11 further caused to:

predict an impact on the network in response to a simulated change including a simulated update to a software application or an expansion of the network.

13. The system of claim 11 further caused to, prior to the impact on the performance metric being simulated:

classify the sensor data based a hardware or software components of the multiple networks, wherein the ML model is optimized in accordance with the classification of the hardware or software components.

14. A method for performing a change to a storage system and mitigating an impact on a performance metric for the storage system, comprising:

receiving sensor data generated by sensors disposed on components of the storage system, wherein the sensor data is indicative of a temperature and power consumption of the components of the storage system, wherein the sensor data is periodically received from the sensors disposed on the components of the storage system;

classifying the sensor data based on a performance metric for the storage system, wherein the performance metric is related to a capability of the storage system based on the temperature and power consumption readings of the sensors, wherein the sensor data is aggregated across a temporal dimension to classify the sensor data to one or more timeframes when the sensor data was generated or captured, wherein the sensor data is further aggregated across a spatial dimension to classify the sensor data based on whether the sensors are disposed on circuitry, devices, or structures of the multiple systems, and wherein the standardized sensor data includes the aggregate sensor data and the classification is based on the temporal dimension and the spatial dimension;

simulating, based on the classified sensor data, the impact on the performance metric in response to a simulated change to the storage system;

determining, based on said simulating, a procedure for mitigating the impact on the performance metric when performing the change to the storage system;

performing the procedure for mitigating the impact on the performance metric when performing the change to the storage system; and generating a network portal that enables end users to perform analytics to mitigate the impact on the performance metric for the storage system.

15. The method of claim 14 further comprising, prior to simulating the impact on the performance metric:

training a machine learning (ML) model to optimize for the performance metric based on the classified sensor data, wherein the simulation of the impact on the performance metric is based on the ML model.

16. The method of claim 14, wherein the change to the storage system includes an update to a software running on the storage system or a hardware expansion of the storage system.

17. The method of claim 14 further comprising:

predicting, based on the classified sensor data, a temperature of the storage system or surrounding the storage system and power consumption by the storage system.

* * * * *